United States Patent [19]

Ohsawa et al.

[11] Patent Number: 5,437,764
[45] Date of Patent: Aug. 1, 1995

[54] LEAD FRAME AND MANUFACTURING METHOD THEREFOR

[75] Inventors: Kenji Ohsawa; Makoto Ito; Mutsumi Nagano, all of Kanagawa, Japan

[73] Assignee: Sony Corporation, Tokyo, Japan

[21] Appl. No.: 248,096

[22] Filed: May 24, 1994

[30] Foreign Application Priority Data

May 25, 1993 [JP] Japan .................... 5-145625

[51] Int. Cl.⁶ .................... B44C 1/22; C23F 1/02
[52] U.S. Cl. .................... 216/14; 257/673; 437/220; 216/12; 216/37; 216/41
[58] Field of Search ............ 257/666, 673, 676, 677; 361/421; 29/827; 437/206, 217, 220; 156/634, 650, 651, 652, 656, 659.1, 901, 902

[56] References Cited

U.S. PATENT DOCUMENTS 5,221,428 6/1993 Ohsawa et al. .................... 156/652

Primary Examiner—William Powell
Attorney, Agent, or Firm—Hill, Steadman & Simpson

[57] ABSTRACT

An inner lead of a lead frame has an outer end portion extending so as to be connected with a side surface of an etching stop layer and with an upper surface of an outer lead. The outer lead is formed by etching both surfaces of a metal base, and the inner lead is formed by plating metal on the metal base with a resist layer used as a mask. The pitch of the outer lead can be made fine, and a bonding strength of the inner lead to the outer lead can be increased.

7 Claims, 3 Drawing Sheets

LEAD FRAME AND MANUFACTURING METHOD THEREFOR

BACKGROUND OF THE INVENTION

1. Field of the Invention

The present invention relates to a lead frame and a manufacturing method therefor, and more particularly to a lead frame and a manufacturing method therefor in which an outer end portion of an inner lead thinner than an outer lead is connected to an inner end portion of the outer lead through an etching stop layer formed of metal different from that of the outer lead.

2. Description of the Related Art

Conventionally known is a lead frame formed by etching a lead frame material having a three-layer structure consisting of a thick copper layer for outer leads, an aluminum layer for etching stops, and a thin copper layer for inner leads (Japanese Patent Application No. Hei 3-274843).

FIG. 1 is a sectional view of such a lead frame in the related art. In FIG. 1, reference numeral 1 generally denotes a lead frame including outer leads of copper, etching stop layers 3 of aluminum formed on inner end portions of the outer leads, respectively, thin inner leads 4 of copper fixed at their outer end portions to the etching stop layers 3, respectively, and bumps 5 of aluminum formed on inner end portions of the inner leads 4, respectively.

The inner end portions of the inner leads 4 are bonded through the bumps 5 to electrode pads 7 of a semiconductor chip 6. The semiconductor chip 6 is sealed by a sealing resin 8.

Such a lead frame 1 is manufactured by individually performing selective etching of the copper layer for the outer leads and selective etching of the copper layer for the inner leads. In the manufacture of the lead frame 1, the etching of the copper layer for the outer leads in performing the selective etching of the copper layer for the inner leads is hindered by the aluminum layer, and the etching of the copper layer for the inner leads in performing the selective etching of the copper layer for the outer leads.

In another technique, the inner leads are formed by plating copper with a resist film used as a mask, so as to avoid that a fine pitch of the inner leads may be hindered by side etching.

Such a conventional lead frame 1 has a problem such that it is difficult to sufficiently increase a bonding strength between the outer leads 2 and the inner leads 4 because there is a limit in increasing a bonding strength between aluminum and copper. That is, the etching stop layers 3 of aluminum are interposed between the outer leads 2 and the inner leads 4 both of copper, and the outer leads 2 are not in direct contact with the inner leads 4.

Further, since the lead frame material having the three-layer structure is used in the manufacture of the lead frame 1, the patterns of the outer leads are necessarily formed by etching one surface of the lead frame material. As a result, an increase in amount of side etching is unavoidable. Accordingly, there is a limit in making the pitch of the outer leads fine, and the demand for very large scale integration cannot be met.

Further, an IC connected to such a lead frame 1 and sealed by the resin 8 is aged in actual use to possibly cause the intrusion of moisture 9 into the resin 8 and therefore generate a local battery by aluminum and copper. As a result, the progress of corrosion of the aluminum due to the moisture 9 is accelerated.

Additionally, in the technique of forming the inner leads by plating copper with a resist film used as a mask, the fine pitch of the inner leads can be expected, but that of the outer leads cannot be expected. The fine pitch of the outer leads has been increasingly demanded by a great increase in degree of integration and number of pins in ICs.

SUMMARY OF THE INVENTION

It is an object of the present invention to provide a lead frame and a manufacturing method therefor which can realize a fine pitch of an outer lead and increase a bonding strength of an inner lead to the outer lead.

It is another object of the present invention to provide a lead frame and a manufacturing method therefor which can suppress the generation of a local battery by an outer lead, inner lead and etching stop layer to prevent the progress of corrosion of the etching stop layer.

According to a first aspect of the present invention, there is provided a lead frame comprising an outer lead; an etching stop layer formed on said outer lead; and an inner lead formed on said etching stop layer, said inner lead having an outer end portion extending so as to be connected with a side surface of said etching stop layer and with an upper surface of said outer lead.

With this structure, the outer end portion of the inner lead is connected directly to the outer lead. Accordingly, a bonding strength of the inner lead to the outer lead can be increased as compared with the related art wherein the inner lead and the outer lead are completely separated from each other by the etching stop layer. Furthermore, since the inner lead is in direct contact with the outer lead, no potential difference is generated between the inner lead and the outer lead, thereby inhibiting the progress of corrosion of aluminum by moisture due to a local battery.

According to a second aspect of the present invention, there is provided a manufacturing method for a lead frame, comprising the steps of working a metal base in an outer lead forming region thereof to form an outer lead in said outer lead forming region; forming an etching stop layer on a first surface of said metal base in an inner lead forming region thereof, from metal different from that of said outer lead; forming a plating resist layer having a negative pattern with respect to an inner lead pattern, on said first surface of said metal base so as to cover said etching stop layer; plating metal on said metal base with said plating resist layer used as a mask to form an inner lead on said etching stop layer, said inner lead having an outer end portion contact with a surface of said outer lead; etching off a second surface of said metal base in said inner lead forming region; and etching off an unnecessary part of said etching stop layer.

In this manufacturing method, the outer lead is formed by working of the metal base having a single layer rather than a three-layer structure as in the related art, thereby allowing selective etching from both surfaces of the metal base or pressing of the metal base. Accordingly, when the selective etching is carried out, the amount of side etching can be reduced as compared with the conventional method wherein the outer lead is patterned by selectively etching one surface of the metal base, whereas when the pressing is carried out, the side etching can be completely eliminated. Accordingly, the pitch of the outer lead can be made fine.

Furthermore, the outer end portion of the inner lead extend from the edge of the etching stop layer and is directly connected to the outer lead. Accordingly, a bonding strength of the inner lead to the outer lead can be increased, and the generation of a local battery by the inner lead, the outer lead and the etching stop layer can be inhibited.

According to a third aspect of the present invention, there is provided a manufacturing method for a lead frame, comprising the steps of working a metal base in an outer lead forming region thereof to form an outer lead in said outer lead forming region; forming an etching stop layer on a first surface of said metal base in an inner lead forming region thereof, from metal different from that of said outer lead; forming a plating resist layer having a negative pattern with respect to an inner lead pattern, on said first surface of said metal base so as to cover said etching stop layer; plating metal on said metal base with said plating resist layer used as a mask to form an inner lead on said etching stop layer, said inner lead having an outer end portion contact with a surface of said outer lead; etching off a second surface of said metal base in said inner lead forming region; and covering a bump forming portion of said etching stop layer with a mask member and etching off an unnecessary part of said etching stop layer to form a bump on an inner end portion of said inner lead.

In this manufacturing method, the bump is formed on the inner end portion of the inner lead. That is, no bump is required to be formed on a semiconductor chip. Accordingly, there is no possibility that the yield of the semiconductor chip may be reduced by the generation of defectives in the bump forming step.

Further, the bump forming portion of the etching stop layer is preliminarily masked by the mask member in etching the etching stop layer with the outer lead and the inner lead used as a mask. Accordingly, the bump can be formed without an undue increase in number of steps.

According to a fourth aspect of the present invention, there is provided a manufacturing method for a lead frame, comprising the steps of working a metal base in an outer lead forming region thereof to form an outer lead in said outer lead forming region; forming an etching stop layer on a first surface of said metal base in an inner lead forming region thereof, from metal different from that of said outer lead; forming a plating resist layer having a negative pattern with respect to an inner lead pattern, on said first surface of said metal base so as to cover said etching stop layer; plating metal on said metal base with said plating resist layer used as a mask to form an inner lead on said etching stop layer, said inner lead having an outer end portion contact with a surface of said outer lead; etching off a second surface of said metal base in said inner lead forming region; etching off an unnecessary part of said etching stop layer; and forming a bump on an inner end portion of said inner lead.

Also in this manufacturing method, the bump is formed on the inner end portion of the inner lead. That is, no bump is required to be formed on a semiconductor chip. Accordingly, there is no possibility that the yield of the semiconductor chip may be reduced by the generation of defectives in the bump forming step.

Other objects and features of the invention will be more fully understood from the following detailed description and appended claims when taken with the accompanying drawings.

DETAILED DESCRIPTION OF THE PREFERRED EMBODIMENTS

There will now be described some preferred embodiments of the present invention with reference to the drawings.

Figure 2:
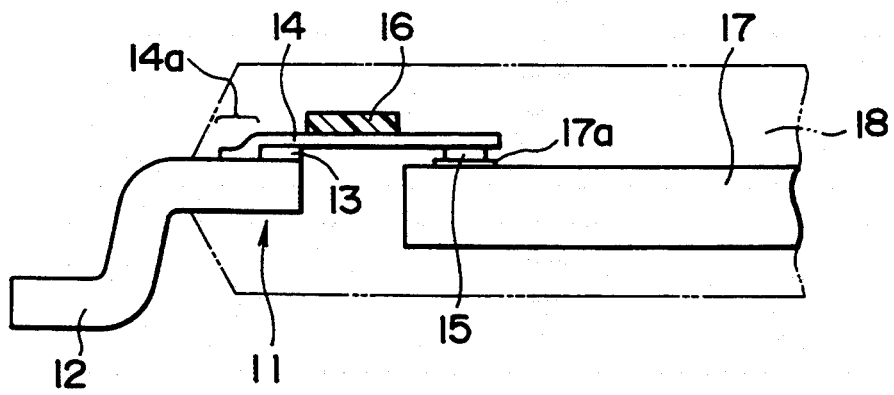
FIG. 2 is a sectional view showing a preferred embodiment of the lead frame according to the present invention.

Referring first to FIG. 2 which shows a preferred embodiment of the lead frame according to the present invention, reference numeral 11 generally denotes a lead frame including a plurality of outer leads 12, a plurality of etching stop layers 13 respectively formed on the upper surfaces of the outer leads 12 at their inner end portions, a plurality of inner leads 14 respectively fixed at their outer end portions to the etching stop layers 13, and a plurality of bumps 15 respectively formed on the lower surfaces of the inner leads 13 at their inner end portions. The outer leads 12 are formed of copper. The etching stop layers 13 are formed of aluminum. The inner leads 14 are formed of copper. The bumps 15 are formed of aluminum. The thickness of each inner lead 13 is smaller than that of each outer lead 12.

Figure 1:
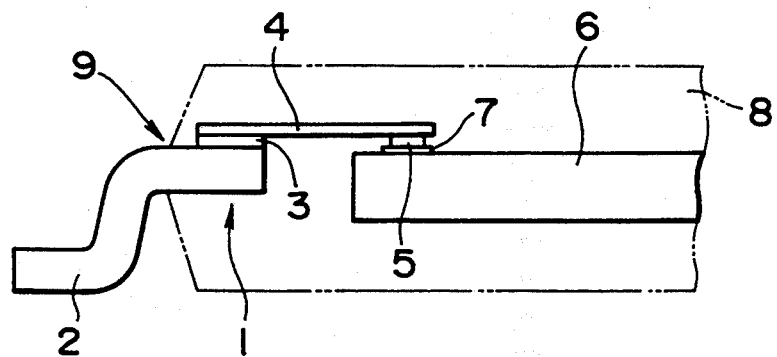
FIG. 1 is a sectional view of a lead frame in the related art.

The lead frame 11 has a structure such that outermost portions 14a of the outer end portions of the inner leads 14 are connected to the inner end portions of the outer leads 12, respectively. That is, the outermost portions 14a of the outer end portions of the inner leads 14 extend to be connected with the side surfaces of the etching stop layers 13 and with the upper surfaces of the inner end portions of the outer leads 12. This structure of the lead frame 11 is quite different from that of the lead frame 1 shown in FIG. 1.

Further, a reinforcement tape 16 is bonded on the upper surfaces of the inner leads 14. The reinforcement tape 16 extends in a direction intersecting a longitudinal direction of each inner lead 14. The reinforcement tape 16 functions to prevent bending of the inner leads 14 and slippage of the positional relation between the inner leads 14.

The inner end portions of the inner leads 14 are bonded through the bumps 15 to electrode pads 17a of a semiconductor chip 17, respectively. Reference numeral 18 denotes a seal resin for sealing the semiconductor 17.

As mentioned above, the structure of the lead frame 11 is featured in that the outermost portions 14a of the inner leads 14 are connected directly to the outer leads 12. Accordingly, a bonding strength of the inner leads 14 to the outer leads 12 can be increased as compared with the lead frame 1 shown in FIG. 1 wherein the inner leads 4 and the outer leads 2 are completely separated from each other by the etching stop layers 3. Furthermore, since the inner leads 14 are in direct contact with the outer leads 12 in this preferred embodiment, no potential difference is generated between the inner leads 14 and the outer leads 12, thereby inhibiting the progress of corrosion of aluminum by moisture due to a local battery.

Referring next to FIGS. 3A to 3H, there is shown a first preferred embodiment of the manufacturing method for the lead frame according to the present invention, wherein the drawings are arranged in the order of steps of the manufacturing method.

Figure 3A:
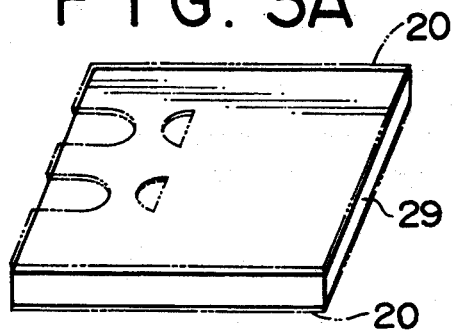
FIGS. 3A to 3H are perspective views showing a first preferred embodiment of the manufacturing method according to the present invention.

As shown in FIG. 3A, a metal base 29 (having a thickness of 80 to 150 $\mu$m, for example) formed of copper alloy or 42 alloy is prepared as a lead frame material. Then, resist films 20 (shown by dot-dash lines) are selectively formed on both surfaces of the metal base 29.

Figure 3B:
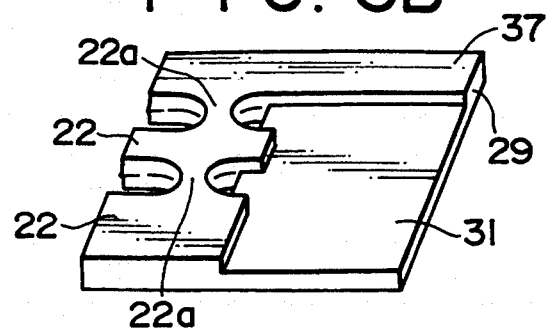

As shown in FIG. 3B, the metal base 29 is selectively etched from its both surfaces with the resist films 20 used as a mask, thereby removing a negative pattern with respect to an outer lead forming pattern. Thus, outer leads 22 connected together by tie bars 22a are formed. At this time, an inner lead forming region 31 of the metal base 29 is covered with the resist films 20, so that this region is not etched.

The formation of the outer leads 22 may be performed by pressing rather than the selective etching mentioned above. When the outer leads 22 are formed by pressing, no side etching occurs.

Then, only the inner lead forming region 31 is half etched from a lower surface 37 of the metal base 29. In FIG. 3B, the lower surface 37 is directed upward. Thus, the thickness of the inner lead forming region 31 is reduced to 50 $\mu$m, for example. Although this half-etching step is not essential, it is effective for a reduction in amount of etching in performing selective etching later.

Figure 3C:
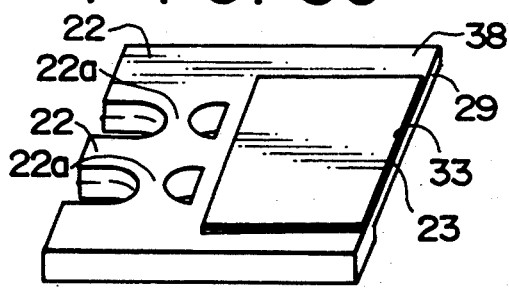

As shown in FIG. 3C, the metal base 29 is turned upside down to upward direct an upper surface 38 of the metal base 29. Then, an etching stop layer 23 (having a thickness of 0.1 to 20 $\mu$m, for example) formed of aluminum is formed by sputtering on the upper surface 38 in the inner lead forming region 31. Then, a copper layer 33 (having a thickness of 2 to 5 $\mu$m, for example) is formed by sputtering on the etching stop layer 23. Although the formation of the copper layer 33 is not essential, it is effective for an increase in bonding strength of inner leads to be formed later.

Figure 3D:
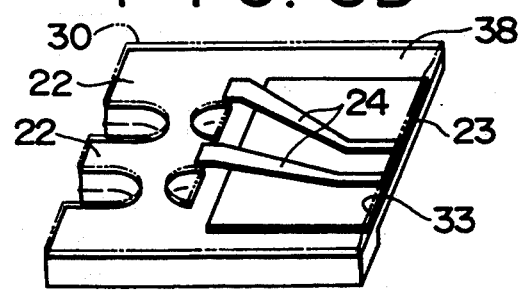

As shown in FIG. 3D, a plating resist layer 30 (shown by a dot-dash line) is selectively formed on the upper surface 38 of the metal base 29 to form a negative pattern with respect to an inner lead forming pattern.

More specifically, an electrodeposition resist (Oligo ED-UV manufactured by Nihon Kagaku Sekiyu) is used as a resist material for the plating resist layer 30. The plating resist layer 30 is formed by coating the resist material with a thickness of 10 to 30 $\mu$m, for example, patterning the coating with exposure of light in an amount of 150 to 40 mJ/cm$^2$, and developing the pattern with a spray of 1% Na$_2$CO$_3$ solution (45° C.).

After the development, acid degreasing is performed, and then the surface of the inner lead pattern is activated with 10% H$_2$SO$_4$ solution. Thereafter, copper sulfate plating is performed to form inner leads 24 on the copper layer 33 formed on the etching stop layer 23 (or directly on the etching stop layer 23 when the copper layer 33 is not formed).

More specifically, the inner leads 24 are formed by electroplating with use of a plating liquid containing 80 g/L of CuSO$_4$, 200 g/L of H$_2$SO$_4$, and 50 ppm of Cl$^-$ at a current density of 1.0 to 4.0 A/dm$^2$. The width of each inner lead 24 is set to 30 $\mu$m, for example, and the space between the inner leads 24 is set to 30 $\mu$m, for example. The inner leads 24 are formed so that the outer end portions thereof project from the edge of the etching stop layer 23.

As a pretreatment prior to the electroplating of copper, nickel sulfate plating may be performed to form a nickel undercoat. Then, the copper plating may be formed on the nickel undercoat, thereby improving a bonding strength of the inner leads 24. Further, the inner leads 24 may be formed by nickel plating rather than the copper plating.

Figure 3E:
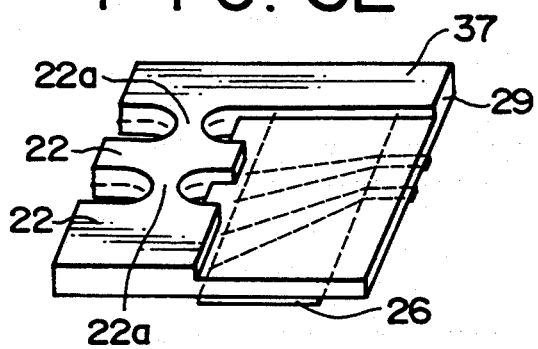

As shown in FIG. 3E, the plating resist layer 30 is removed after the formation of the inner leads 24, and then a reinforcement taper 26 is bonded to the surfaces of the inner leads 24 so as to extend in a direction intersecting a longitudinal direction of each inner lead 24, thereby reinforcing the inner leads 24. More specifically, the reinforcement tape 26 is formed by using a polyimide film having a thickness of about 50 $\mu$m either surface of which is coated with a B-stage epoxy adhesive, and suitably cutting the polyimide film. The reinforcement tape 26 is bonded to the inner leads 24 by using a hot roller heated to about 150° C.

Thereafter, the metal base 29 is turned upside down to upward direct the lower surface 37 of the metal base 29.

Figure 3F:
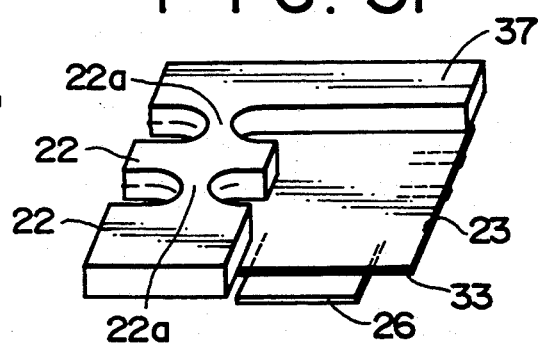

As shown in FIG. 3F, a part of the metal base 29 in the inner lead forming region 31 on the back side of the etching stop layer 23 (i.e., on the upper side shown in FIG. 3F) is completely removed by selective etching. The selective etching is performed by using a mixture of 10–20% H$_2$O$_2$ solution and 10–18% H$_2$SO$_4$ as an etching liquid and spraying the mixture heated to 45° C.

Accordingly, the back surface of the etching stop layer 23 formed of aluminum is exposed.

Figure 3G:
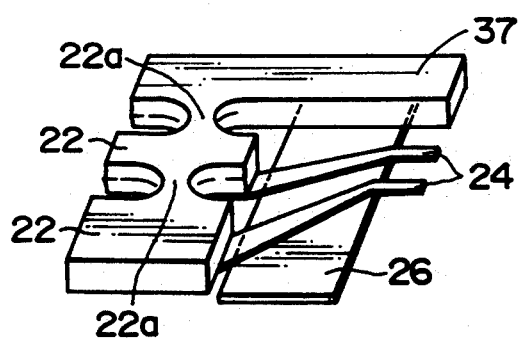

As shown in FIG. 3G, the etching stop layer 23 is etched with the inner leads 24 and the outer leads 22 used as a mask to remove an unnecessary part of the etching stop layer 23. In performing the etching of the etching stop layer 23, it is of course necessary to etch the aluminum forming the etching stop layer 23 but not to etch the copper forming the outer leads 22 and the inner leads 24. In the case of wet etching, a phosphoric acid containing etching liquid is used. In the case of dry etching, an etching gas composed of BCl$_3$ (40 SCCM), Cl$_2$ (100 SCCM), and He or N$_2$ (1500 SCCM) is used to perform RIE under the conditions of RF power of 220 W, pressure of 130 Pa, table temperature of 5° C., and rate of 7 $\mu$m/240 sec, for example.

It is considered that the etching is performed so as to leave the aluminum on the surfaces of the inner leads 24 or not to leave the aluminum on the surfaces of the inner leads 24. In the former case, the etching is performed from the upper surfaces of the inner leads 24 (i.e., the lower side shown in FIG. 3G). In the latter case, the etching is performed from the lower surfaces of the inner leads 24 (i.e., the upper side shown in FIG. 3G).

Thereafter, the copper layer 33 under the etching stop layer 23 is completely removed by using a copper etching material. As a result, the inner leads 24 are completely isolated (however, they are short-circuited by the tie bars 22a connecting the outer leads 22 until an unnecessary part of the outer leads 22 is cut away after resin sealing).

Figure 3H:
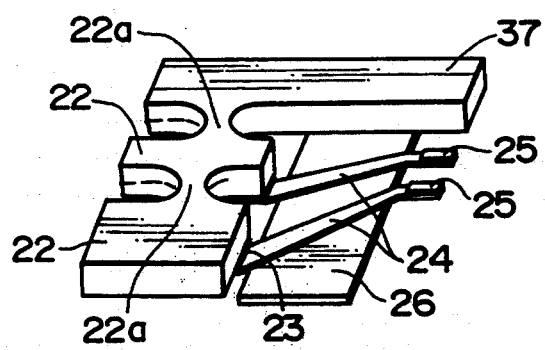

As shown in FIG. 3H, bumps 25 are respectively formed on the inner end portions of the inner leads 24 by sputtering, photoetching, etc. of aluminum.

According to the manufacturing method mentioned above, the outer leads 24 are formed by the selective etching from both surfaces of the metal base 29. Accordingly, the amount of side etching can be reduced as compared with the conventional method wherein the outer leads are patterned by selectively etching one surface of the metal base. Concretely, the amount of side etching can be reduced to about ½ as compared with the conventional method.

Accordingly, the pitch of the outer leads can be made fine.

Furthermore, the outer end portions of the inner leads 24 extend from the edge of the etching stop layer 23 and are directly connected to the outer leads 22. Accordingly, a bonding strength of the inner leads 24 to the outer leads 22 can be increased, and the generation of a local battery by the inner lead 24, the outer lead 22 and the etching stop layer 23 can be inhibited.

Moreover, the bumps 25 are formed on the inner end portions of the inner leads 24. That is, no bumps are required to be formed on a semiconductor chip. Accordingly, there is no possibility that the yield of the semiconductor chip may be reduced by the generation of defectives in the bump forming step.

Figure 4A:
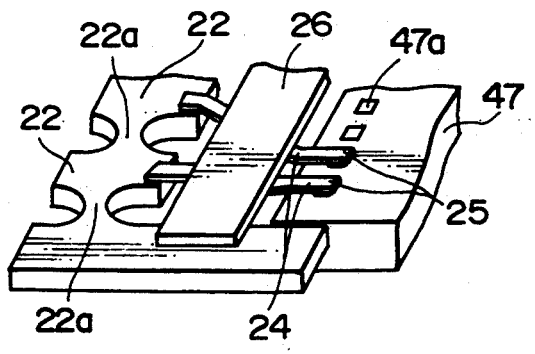
FIGS. 4A and 4B are perspective views showing the assembling of a semiconductor device after manufacturing the lead frame as shown in FIGS. 3A to 3H.
Figure 4B:
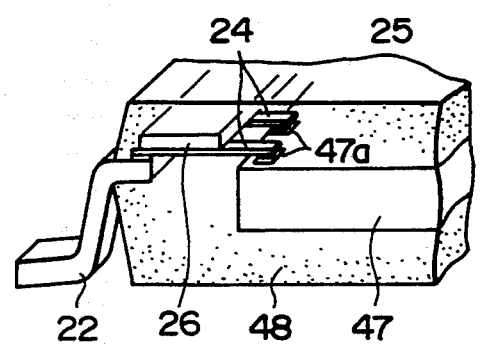

FIGS. 4A and 4B show the assembling of a semiconductor device after manufacturing the lead frame as shown in FIGS. 3A to 3H. As shown in FIG. 4A, the inner end portions of the inner leads 24 are connected through the bumps 25 to electrode pads 47a of a semiconductor chip 47. Then, as shown in FIG. 4B, the semiconductor chip 47 is sealed by a seal resin 48.

The connection between the bumps 25 at the inner end portions of the inner leads 24 and the electrode pads 47a of the semiconductor chip 47 is performed by single-point ultrasonic bonding.

Figure 5A:
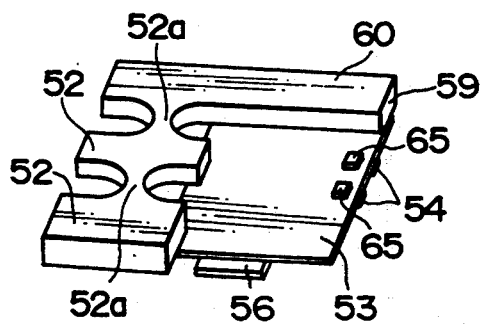
FIGS. 5A and 5B are perspective views showing a second preferred embodiment of the manufacturing method according to the present invention.
Figure 5B:
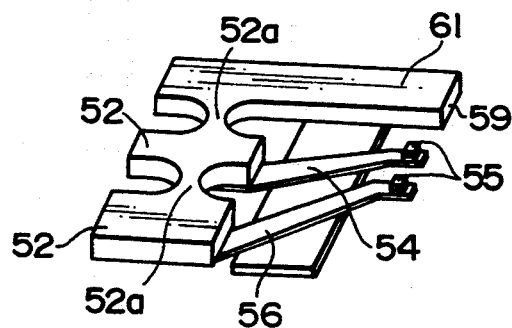

FIGS. 5A and 5B show a second preferred embodiment of the manufacturing method according to the present invention. In the second preferred embodiment, the steps from FIGS. 3A to 3E of the first preferred embodiment are applied in the same manner.

After a part of a metal base 59 in an inner lead forming region is removed to expose an etching stop layer 53 (see FIG. 3F), mask members 65 are formed from an electrodeposition resist on the etching stop layer 53 at a bump forming portion as shown in FIG. 5A.

Then, as shown in FIG. 5B, an unnecessary part of the etching stop layer 53 is removed by etching, and then the mask members 65 are removed. As a result, bumps 55 of aluminum are formed from the etching stop layer 53 left on the inner end portions of the inner leads 54.

In FIGS. 5A and 5B, reference numerals 52, 52a, and 56 denote outer leads, tie bars, and a reinforcement tape, respectively. Further, reference numerals 60 and 61 denote a lower surface and an upper surface of the metal base 59, respectively.

According to the manufacturing method of the second preferred embodiment, the bump forming portion of the etching stop layer 53 is preliminarily masked by the mask members 65 in etching the etching stop layer 53 with the outer leads 52 and the inner leads 54 used as a mask. Accordingly, the bumps 55 can be formed without an undue increase in number of steps.

Figure 6A:
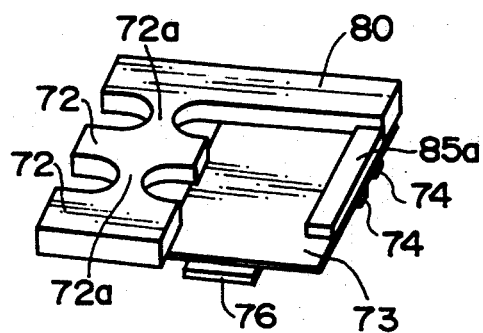
FIGS. 6A and 6B are perspective views showing a third preferred embodiment of the manufacturing method according to the present invention.
Figure 6B:
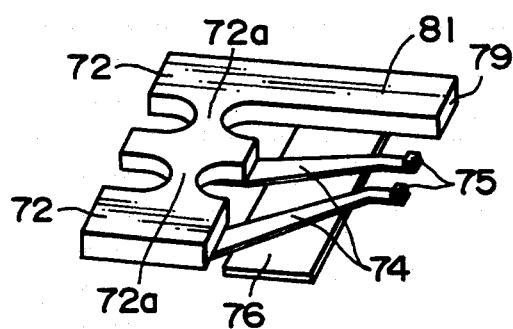

FIGS. 6A and 6B show a third preferred embodiment of the manufacturing method according to the present invention. Also in this preferred embodiment, the steps from FIGS. 3A to 3E are applied in the same manner.

After a part of a metal base 79 in an inner lead forming region is removed to expose an etching stop layer 73 (see FIG. 3F), a mask member 85a formed from a photoresist and a jig is positioned on a bump forming portion of the etching stop layer 73 so as to extend in a direction intersecting a longitudinal direction of each inner lead 73 as shown in FIG. 6A.

Then, as shown in FIG. 6B, an unnecessary part of the etching stop layer 73 is removed by etching, and then the mask member 85a is removed. As a result, bumps 75 of aluminum are formed from the etching stop layer 73 left on the inner end portions of the inner leads 74.

In FIGS. 6A and 6B, reference numerals 72, 72a, and 76 denote outer leads, tie bars, and a reinforcement tape, respectively. Further, reference numerals 80 and 81 denote a lower surface and an upper surface of the metal base 79, respectively.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A lead frame comprising:
   an outer lead;
   an etching stop layer formed on said outer lead; and
   an inner lead formed on said etching stop layer, said inner lead having an outer end portion extending so as to be connected with a side surface of said etching stop layer and with an upper surface of said outer lead.

2. A lead frame according to claim 1, wherein said inner lead has a thickness smaller than that of said outer lead.

3. A lead frame according to claim 1, wherein said etching stop layer and said outer lead are formed of different metals.

4. A lead frame according to claim 3, wherein said etching stop layer is formed of aluminum.

5. A manufacturing method for a lead frame, comprising the steps of:
   working a metal base in an outer lead forming region thereof to form an outer lead in said outer lead forming region;
   forming an etching stop layer on a first surface of said metal base in an inner lead forming region thereof, from metal different from that of said outer lead;
   forming a plating resist layer having a negative pattern with respect to an inner lead pattern, on said first surface of said metal base so as to cover said etching stop layer;
   plating metal on said metal base with said plating resist layer used as a mask to form an inner lead on said etching stop layer, said inner lead having an outer end portion contact with a surface of said outer lead;
   etching off a second surface of said metal base in said inner lead forming region; and etching off an unnecessary part of said etching stop layer.

6. A manufacturing method for a lead frame, comprising the steps of:
   working a metal base in an outer lead forming region thereof to form an outer lead in said outer lead forming region;
   forming an etching stop layer on a first surface of said metal base in an inner lead forming region thereof, from metal different from that of said outer lead;
   forming a plating resist layer having a negative pattern with respect to an inner lead pattern, on said first surface of said metal base so as to cover said etching stop layer;
   plating metal on said metal base with said plating resist layer used as a mask to form an inner lead on said etching stop layer, said inner lead having an outer end portion contact with a surface of said outer lead;
   etching off a second surface of said metal base in said inner lead forming region; and
   covering a bump forming portion of said etching stop layer with a mask member and etching off an unnecessary part of said etching stop layer to form a bump on an inner end portion of said inner lead.

7. A manufacturing method for a lead frame, comprising the steps of:
   working a metal base in an outer lead forming region thereof to form an outer lead in said outer lead forming region;
   forming an etching stop layer on a first surface of said metal base in an inner lead forming region thereof, from metal different from that of said outer lead;
   forming a plating resist layer having a negative pattern with respect to an inner lead pattern, on said first surface of said metal base so as to cover said etching stop layer;
   plating metal on said metal base with said plating resist layer used as a mask to form an inner lead on said etching stop layer, said inner lead having an outer end portion contact with a surface of said outer lead;
   etching off a second surface of said metal base in said inner lead forming region;
   etching off an unnecessary part of said etching stop layer; and
   forming a bump on an inner end portion of said inner lead.

* * * * *